(12) United States Patent
Mayer et al.

(10) Patent No.: US 10,163,889 B2
(45) Date of Patent: Dec. 25, 2018

(54) PHASE SHIFTER

(71) Applicant: Fraunhofer-Gesellschaft zur Foerderung der angewandten Forschung e.V., Munich (DE)

(72) Inventors: Frank Mayer, Baiersdorf (DE); Mario Schuehler, Effeltrich (DE); Michael Schlicht, Seligenporten (DE); Rainer Wansch, Baiersdorf (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/706,371

(22) Filed: Sep. 15, 2017

(65) Prior Publication Data

US 2018/0006014 A1 Jan. 4, 2018

Related U.S. Application Data

(63) Continuation of application No. PCT/EP2015/056147, filed on Mar. 23, 2015.

(51) Int. Cl.
*H01L 27/02* (2006.01)
*H01P 1/18* (2006.01)
(Continued)

(52) U.S. Cl.
CPC .......... *H01L 27/0251* (2013.01); *H01P 1/184* (2013.01); *H01P 1/185* (2013.01);
(Continued)

(58) Field of Classification Search
CPC ...... H01L 27/0251; H02H 3/445; H03H 7/19; H04B 1/0057; H04B 1/50; H05K 1/0259
(Continued)

(56) References Cited

U.S. PATENT DOCUMENTS 5,917,220 A * 6/1999 Waggoner ........... H01L 27/0251
257/355
7,881,679 B1 * 2/2011 Faravash ............... H01L 21/761
257/548
(Continued)

FOREIGN PATENT DOCUMENTS

EP 1450488 A1 8/2004

OTHER PUBLICATIONS

Garver, "Broad-Band Diode Phase Shifters", IEEE Transactions on Microwave Theory and Techniques; vol. 20; No. 5, May 1972, pp. 314-323.
(Continued)

*Primary Examiner* — Hirdepal Singh
(74) *Attorney, Agent, or Firm* — Perkins Coie LLP; Michael A. Glenn

(57) ABSTRACT

A phase shifter includes a signal input, a signal output, an ESD protection circuit, first and second signal paths between the signal input and the signal output. The ESD protection circuit includes first and second two port devices, each two port device being switchable between a high impedance state and a low impedance state. The first signal path includes the first two port device of the ESD protection circuit and a first delay line configured to provide a first phase shift to a signal transmitted from the signal input to the signal output via the first signal path. The second signal path includes the second two port device of the ESD protection circuit and a second delay line configured to provide a second phase shift, different from the first phase shift, to the signal transmitted from the signal input to the signal output via the second signal path.

17 Claims, 5 Drawing Sheets

(51) Int. Cl.
*H01P 1/185* (2006.01)
*H05K 1/02* (2006.01)
*H02H 3/44* (2006.01)
*H03H 7/19* (2006.01)
*H04B 1/00* (2006.01)
*H04B 1/50* (2006.01)

(52) U.S. Cl.
CPC .............. *H02H 3/445* (2013.01); *H03H 7/19* (2013.01); *H04B 1/0057* (2013.01); *H04B 1/50* (2013.01); *H05K 1/0259* (2013.01)

(58) Field of Classification Search
USPC .......................................................... 375/300
See application file for complete search history.

(56) References Cited

U.S. PATENT DOCUMENTS

| | | | | |
|---|---|---|---|---|
| 8,704,575 B2* | 4/2014 | Hur | ............................ | H01P 5/18 327/231 |
| 2006/0109066 A1* | 5/2006 | Borysenko | .............. | H01P 1/185 333/164 |
| 2008/0100973 A1* | 5/2008 | Soldner | ..................... | H03F 1/52 361/56 |
| 2008/0112101 A1* | 5/2008 | McElwee | ............ | H01L 27/0251 361/56 |
| 2011/0279935 A1* | 11/2011 | Iwasa | ................... | H03H 7/0107 361/56 |
| 2012/0081822 A1* | 4/2012 | Woo | ..................... | H01L 27/0251 361/56 |
| 2016/0127157 A1* | 5/2016 | Wojnowski | ........... | H04L 25/085 375/257 |
| 2016/0352008 A1* | 12/2016 | Chen | ...................... | H01C 21/50 |

OTHER PUBLICATIONS

Hyvonen et al., "Cancellation technique to provide ESD protection for multi-GHz RF inputs", Electronic Letters; vol. 39; No. 3, Feb. 6, 2003, pp. 284-286.

Koul et al., "Microwave and Millimeter Wave Phase Shifters", Artech House; Boston, 1991, pp. 6-11, pp. 406-409.

Müller et al., "Tunable Passive Phase Shifter for Microwave Application using Highly Anisotropic Liquid Crystals", Microwave Symposium Digest; 2004 IEEE MTT-S International; vol. 2, Jun. 6-11, 2004, pp. 1153-1156.

Weil et al., "Tunable Inverted Tunable Inverted-Microstrip Phase Shifter Device Using Nematic Liquid Crystals", Microwave Symposium Digest; 2002 IEEE MTT-S International; vol. 1, Jun. 2-7, 2002, pp. 367-371.

* cited by examiner

PHASE SHIFTER

CROSS-REFERENCE TO RELATED APPLICATIONS

This application is a continuation of copending International Application No. PCT/EP2015/056147, filed Mar. 23, 2015, which is incorporated herein by reference in its entirety.

The present invention relates to a phase shifter and, in particular, to a phase shifter configured to provide an adjustable phase shift to a signal using the switching capabilities of an ESD protection circuit (ESD=electrostatic discharge). Some embodiments relate to a phase shifter implementation for switched transmission lines.

BACKGROUND OF THE INVENTION

In mobile scenarios, wireless communications systems take advantage of phased array antennas that allow for an optimal steering of the radiation characteristics. The phased array is able to adapt its radiation characteristics according to the instantaneous situation. That is, the main beam of radiation can be electronically aligned towards the remote station, independent of the relative orientation between both. This leads to a high signal quality and reliable transmission without any mechanical re-orientation of the antenna.

The beam forming in a phased array relies on the phase progression along the radiating aperture. This phase progression is generated by an excitation network, which allows electronical variation of the phase of the signal to be transmitted or the signal received. A key component of phased arrays is therefore a phase shifter. The phase shifter is a two-port device that introduces a tuneable phase lag to the passing signal between the input port and the output port.

In electronically controlled phase shifters, the phase lag can be tuned via an electrical signal. Depending on the architecture, the tuning can be done continuously or in discrete steps. In continuously tuneable phase shifters, an analogue signal is applied to the phase shifter. While a continuously tuneable phase shifter provides an arbitrary phase shift, it is more sensitive to temperature variations, manufacturing tolerances and alike. Application of continuously tuneable phase shifters therefore needs means for calibration to compensate for phase errors. With a discrete tuneable phase shifter, the phase shift can only be varied within a limited set of steps, restricting the beam forming capabilities in a phased array. Yet discrete tuneable phase shifters are usually less sensitive to environmental variations or manufacturing tolerances and might therefore be easier to implement with lower calibration effort.

Implementations of electronic phase shifters have been well known for several decades. Early implementations were based on PIN diodes, which served as switching devices. FIGS. 4a to 4c show single sections of so-called switched-line phase shifters using series switches and shunt switches, respectively. FIG. 4a shows series switches, FIG. 4b shows shunt switches, and FIG. 4c shows an example implementation using switching shunt diodes D1 to D4. Examples of such phase shifters are described in R. V. Garver, "Broad-Band Diode Phase Shifters," IEEE Transactions on Microwave Theory and Techniques, vol. 20, no. 5, pp. 314-323, May 1972; and S. K. Koul and B. Bhat, "Microwave and Millimeter Wave Phase Shifters", Artech House, Boston, 1991, for example. With a cascade of multiple sections each representing another phase shift, the total phase shift can be altered in discrete steps. The phase shift of section n is given by $\psi_n = k(l_n - l)$, with k being the wavenumber and l and $l_n$ being the mechanical length of the respective line. The switched-line phase shifter therefore relies on the length variation of the path, which is passed by the signal. A switched-line phase shifter of N sections with a total phase shift of 360 degrees has a resolution of $360°/2^N$. Suppose a 3-bit phase shifter, i.e., N=3, the resolution amounts 45°.

Among switching between lines of different mechanical lengths, a phase shift can also be achieved by tuning of material characteristics, i.e., the electrical length of the line is altered rather than the mechanical length thereof. A line section of mechanical length l shows a phase shift of $\psi = k(\mu_r, \varepsilon_r)l$. The wavenumber k follows from $$k(\mu_r, \varepsilon_r) = 2\pi f \frac{n}{c} = 2\pi f \frac{\sqrt{\mu_r \varepsilon_r}}{c}$$

with c the free-space velocity of light, f the frequency, n the refractive index, $\mu_r$ the relative permeability, and $\varepsilon_r$ the relative permittivity of the substrate supporting the transmission line. A variation of $\mu_r$ or $\varepsilon_r$ causes a variation of k and, therefore, a varying phase.

This approach was pursued in ferrite-type phase shifters, where the permeability of a ferrite material is varied by an external magnetic field applied to it, as described in S. K. Koul and B. Bhat, "Microwave and Millimeter Wave Phase Shifters", Artech House, Boston, 1991. The drawback of ferrites is their losses, especially occurring at frequency above 1 GHz.

In recent years, non-linear dielectric materials became available and have been used for the implementation of phase shifting devices. In contrast to ferrite-type phase shifters, the permittivity is varied while $\mu_r = 1$. Non-linear dielectrics include so-called ferroelectrics, a solid mixture (e.g. mixtures of Barium, Strontium, and Titanate), and so-called liquid crystals (LC). Applying an electric field of proper strength to a non-linear dielectric causes a variation of the permittivity and, therefore, of the phase.

Implementations of phase shifters featuring LC mixtures rely on a continuous variation of the permittivity, such as those described in C. Weil, G. Luessem, R. Jacoby, "Tunable Inverted Tunable Inverted-Microstrip Phase Shifter Device Using Nematic Liquid Crystals," Microwave Symposium Digest, 2002 IEEE MTT-S International (Vol. 1), 2-7 Jun. 2002, Seattle, Wash., USA, pp. 367-371; and S. Müller et al., "Tunable Passive Phase Shifter for Microwave Application using Highly Anisotropic Liquid Crystals," Microwave Symposium Digest, 2004 IEEE MTT-S International (Vol. 2), 6-11 Jun. 2004. Variations caused by temperature variations, for example, have therefore to be monitored and considered for the biasing of the LC mixture. This holds also for ferroelectric and ferrite-based solutions. Phased arrays comprising tens or hundreds of phase shifters need much effort for calibration.

SUMMARY

According to an embodiment, a phase shifter may have: a signal input; a signal output; an electrostatic discharge protection circuit including a first two port device and a second two port device, each two port device being switchable between a high impedance state and a low impedance state; a first signal path between the signal input and the signal output, wherein the first signal path includes the first two port device of the electrostatic discharge protection circuit and a first delay line configured to provide a first phase shift to a signal transmitted from the signal input to the signal output via the first signal path; and a second signal path between the signal input and the signal output, wherein the second signal path includes the second two port device of the electrostatic discharge protection circuit and a second delay line configured to provide a second phase shift, different from the first phase shift, to the signal transmitted from the signal input to the signal output via the second signal path; wherein the electrostatic discharge protection circuit is a circuit that is conventionally used for protecting electrostatic discharge sensitive electronic circuits from an electrostatic discharge; and wherein the first two port device and the second two port device are capable of non-destructively discharging electrostatic discharge voltages or electrostatic discharge currents in an electrostatic discharge event; wherein each of the two port devices of the electrostatic discharge protection circuit is implemented by means of two reverse connected diodes;
 or by means of a uni-directional high-speed diode adapted to be operated in a reverse breakdown operation mode in the low impedance state.

According to another embodiment, a phase shifter may have: a signal input; a signal output; an electrostatic discharge protection circuit including a two port device, the two port device being switchable between a high impedance state and a low impedance state; a first signal path between the signal input and the signal output, wherein the first signal path includes the two port device of the electrostatic discharge protection circuit; and a second signal path between the signal input and the signal output, wherein the second signal path includes a delay line configured to provide a phase shift to the signal transmitted from the signal input to the signal output via the second signal path; wherein the phase shifter is configured to apply an adjustable phase shift to the signal transmitted from the signal input to the signal output by switching the two port device from the low impedance state to the high impedance state; wherein the electrostatic discharge protection circuit is a circuit that is conventionally used for protecting electrostatic discharge sensitive electronic circuits from an electrostatic discharge; and wherein the first two port device and the second two port device are capable of non-destructively discharging electrostatic discharge voltages or electrostatic discharge currents in an electrostatic discharge event; wherein each of the two port devices of the electrostatic discharge protection circuit is implemented by means of two reverse connected diodes;
 or by means of a uni-directional high-speed diode adapted to be operated in a reverse breakdown operation mode in the low impedance state.

Embodiments provide a phase shifter comprising a signal input, a signal output, an ESD protection circuit (ESD=electrostatic discharge), a first signal path between the signal input and the signal output and a second signal path between the signal input and the signal output. The ESD protection circuit comprises a first two port device and a second two port device, each two port device being switchable between a high impedance state and a low impedance state. The first signal path comprises the first two port device of the ESD protection circuit and a first delay line configured to provide a first phase shift to a signal transmitted from the signal input to the signal output via the first signal path. The second signal path comprises the second two port device of the ESD protection circuit and a second delay line configured to provide a second phase shift, different from the first phase shift, to the signal transmitted from the signal input to the signal output via the second signal path.

According to the concept of the present invention, the first and second two port devices of the ESD protection circuit are used for selecting via which of the first and second delay lines a signal present at the signal input of the phase shifter is transmitted to the output of the phase shifter thereby applying a phase shift to the signal transmitted in dependence on a length, e.g., mechanical length or electrical length, of the respective delay line.

The ESD protection circuit is a circuit that is conventionally used for protecting ESD sensitive electronic circuits from an electrostatic discharge, such as from high currents (e.g., current peaks) or high voltages (e.g., voltage peaks) that would otherwise damage the electronic circuits or devices. Such high currents (ESD currents) or high voltages (ESD voltages) are currents or voltages that (temporarily) exceed a maximum voltage or current level that the respective electronic circuits or devices may withstand without taking damage. For example, some electronic devices may suffer a dielectric breakdown in an ESD event.

For that purpose, the first two port device and the second two port device can be capable of non-destructively discharging high voltages (ESD voltages) or currents (ESD currents) in an ESD event. In other words, the first two port device and the second two port device can be optimized to discharge voltage peaks or current peaks in a fast manner such that the ESD protection circuit is capable of protecting electronic devices connected downstream the ESD protection circuit from the voltage peaks (ESD voltages) or current peaks (ESD currents). In other words, the first two port device and the second two port device can be configured to provide a low impedance at high frequencies such that the ESD protection circuit is capable of conducting fast transient voltages or currents.

In contrast to PIN diodes (or other electronic devices conventionally used in a phase shifter) that would take damage in an ESD event, the two port devices of the ESD protection circuit, which are used for implementing the phase shifter, are capable of non-destructively discharging ESD voltages or ESD currents in an ESD event. For example, the first two port device and the second two port device can be adapted to be operated in a reverse breakdown operation mode in the low impedance state.

The two port devices of the ESD protection circuit can be implemented, for example, by means of two reverse connected diodes, a uni-directional high-speed diode, a varactor type device or a thyristor type device.

Further embodiments provide a phase shifter comprising a signal input, a signal output, an ESD protection circuit and n signal paths between the signal input and the signal output. The ESD protection circuit comprises n two port devices, each of the n two port devices being switchable between a high impedance state and a low impedance state. Further, each of the n signal paths comprises one delay line of n delay lines, each of the n delay lines being configured to provide a phase shift to the signal transmitted from the signal input to the signal output, wherein n is a natural number equal to or greater than two. Thereby, the phase shifts of n the delay lines differ from each other. For example, the phase shifts of the n delay lines may differ by 360°/n.

Further embodiments provide a phase shifter comprising a signal input, a signal output, an ESD protection circuit, a first signal path between the signal input and the signal output and a second signal path between the signal input and the signal output. The ESD protection circuit comprises a two port device, the two port device being switchable between a high impedance state and a low impedance state. The second signal path comprises a delay line configured to provide a phase shift to the signal transmitted from the signal input to the signal output via the second signal path. The phase shifter is configured to apply an adjustable phase shift to the signal transmitted from the signal input to the signal output by switching the two port device from the low impedance state to the high impedance state.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
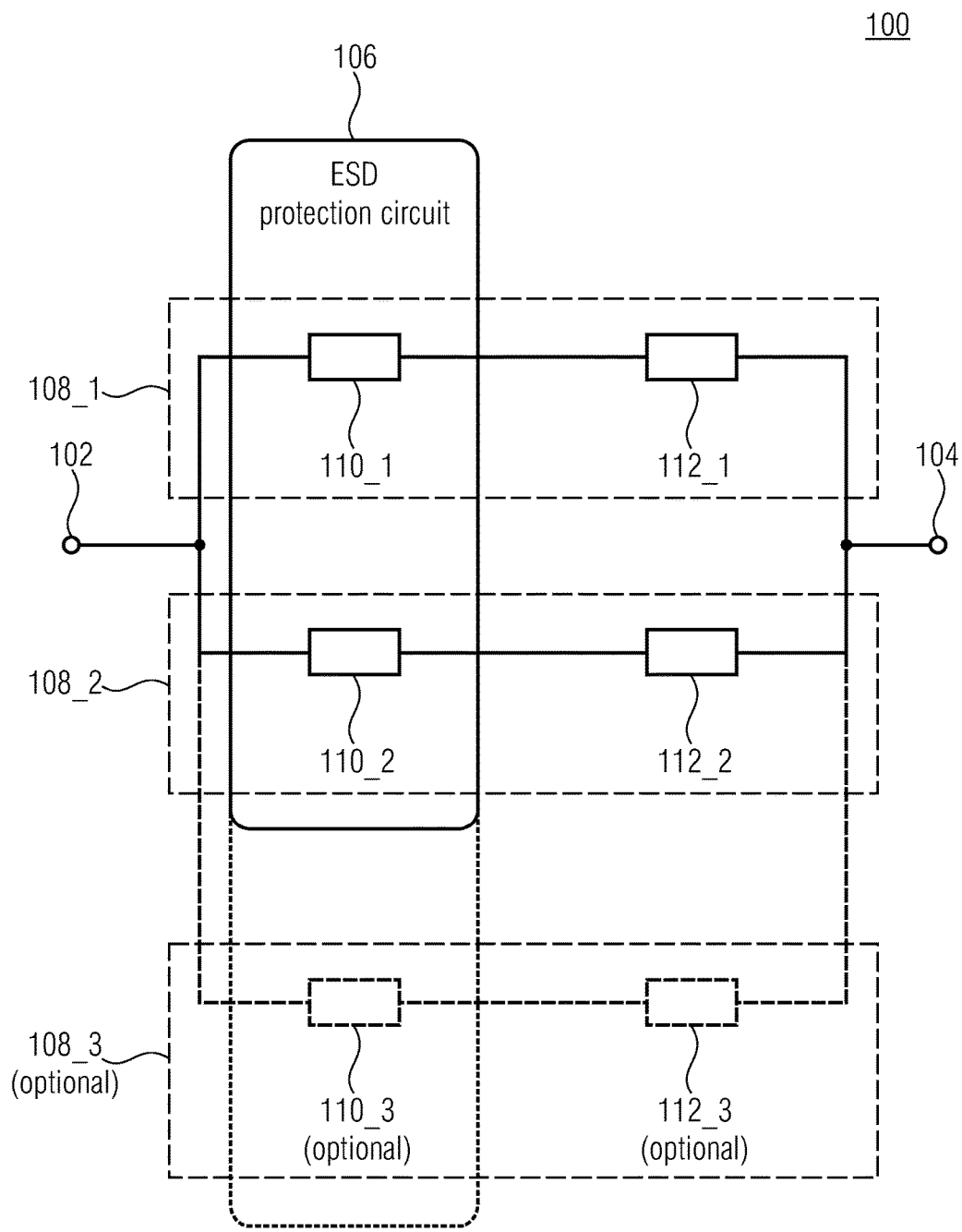
FIG. 1 shows a schematic block diagram of a phase shifter according to an embodiment.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without the specific details. In other instances, well-known structures and devices are shown in block diagram form rather than in detail in order to avoid obscuring embodiments of the present invention. In addition, features of the different embodiments described hereinafter may be combined with each other unless specifically noted otherwise.

FIG. 1 shows a schematic block diagram of a phase shifter 100 according to an embodiment. The phase shifter 100 comprises a signal input (e.g., a RF input (RF=radio frequency)) 102, a signal output (e.g., a RF output) 104, an ESD protection circuit 106, a first signal path 108_1 between the signal input 102 and the signal output 104 and a second signal path 108_2 between the signal input 102 and the signal output 104.

The ESD protection circuit 106 comprises a first two port device 110_1 and a second two port device 110_2, each two port device 110_1 and 110_2 being switchable between a high impedance state (e.g., non-conducting state) and a low impedance state (e.g., conducting state).

The first signal path 108_1 comprises the first two port device 110_1 of the ESD protection circuit 106 and a first delay line 112_1 configured to provide a first phase shift to a signal transmitted from the signal input 102 to the signal output 104 via the first signal path 108_1. The second signal path 108_2 comprises the second two port device 110_2 of the ESD protection circuit 106 and a second delay line 112_2 configured to provide a second phase shift, different from the first phase shift, to the signal transmitted from the signal input 102 to the signal output 104 via the second signal path 108_2.

Note that, the ESD protection circuit 106 may comprise up to n two port devices 110_1 to 110_n, each of the n two port devices being switchable between a high impedance state and a low impedance state, wherein the phase shifter 100 may comprise n signal paths 108_1 to 108_n between the signal input 102 and the signal output 104, each signal path comprising one of the n two port devices of the ESD protection circuit 106 and one of the n delay lines 112_1 to 112_n, each delay line being configured to provide a phase shift to the signal transmitted from the signal input 102 to the signal output 104, wherein n is a natural number equal to or greater than two.

The phase shifter 100 can be configured to apply an adjustable phase shift to the signal transmitted from the signal input 102 to the signal output 104 by switching one out of the first two port device 110_1 and second two port device 110_2 from the low impedance state to the high impedance state. Thereby, the first two port device 110_1 and the second two port device 110_2 can be individually switchable between the low impedance state and the high impedance state.

For example, the phase shifter 100 can be configured to switch the first two port device 110_1 to the low impedance state and the second two port device 110_2 to the high impedance state, such that the signal is transmitted via the first signal path 108_1 from the signal input 102 to the signal output 104 thereby applying the first phase shift by means of the first delay line 112_1 to the signal transmitted.

Naturally, the phase shifter 100 can be configured to switch the first two port device 110_1 to the high impedance state and the second two port device 110_2 to the low impedance state, such that the signal is transmitted via the second signal path 108_2 from the signal input 102 to the signal output 104 thereby applying the second phase shift by means of the second delay line 112_2 to the signal transmitted.

As already mentioned, each of the first two port device 110_1 and second two port device 110_2 is switchable between a high impedance state and a low impedance state. Thereby, the low impedance state can be a conducting state in which the signal is transmitted via the respective two port device without being substantially attenuated by the two port device (e.g., a state in which the signal input 102 and the respective delay line are connected by means of the respective two port device). The high impedance state can be a non-conducting state in which the signal is substantially not transmitted via the respective two-port device (e.g., a state in which the signal input 102 and the respective delay line are disconnected by means of the respective two port device). However, even if a two port device is switched to the high impedance state, a small portion of the signal to be transmitted from the signal input 102 to the signal output 104 may leak through the respective two port device, e.g., due to a parasitic capacitance of the respective two port device.

Therefore, in some embodiments, the first phase shift provided by the first delay line 112_1 and the second phase shift provided by the second delay line 112_2 may differ in such a manner that a signal transmitted from the signal input 102 to the signal output 104 via one of the first two port device 110_1 and the second two port device 110_2 and a signal leaked trough the other one of the first two port device 110_1 and the second two port device 110_2 from the signal input 102 to the signal output 104 superimpose such that the signal transmitted is attenuated by the signal leaked without affecting the phase of the signal transmitted.

For example, the phase shifter 100 can be configured to switch the first two port device 110_1 to the low impedance state and the second two port device 110_2 to the high impedance state. In that case, the signal is transmitted from the signal input 102 to the signal output 104 via the first two port device 110_1, wherein a small portion of the signal leaks through the second two port device 110_2 from the signal input 102 to the signal output 104. The first phase shift provided by the first delay line 112_1 and the second phase shift provided by the second delay line 112_2 may differ in such a manner that the signal transmitted and the signal leaked superimpose such that the signal transmitted is attenuated by the signal leaked without affecting the phase of the signal transmitted.

Naturally, the phase shifter 100 can also be configured to switch the first two port device 110_1 to the high impedance state and the second two port device 110_2 to the low impedance state. In that case, the signal is transmitted from the signal input 102 to the signal output 104 via the second two port device 110_2, wherein a small portion of the signal leaks through the first two port device 110_1 from the signal input 102 to the signal output 104. The first phase shift provided by the first delay line 112_1 and the second phase shift provided by the second delay line 112_2 may differ in such a manner that the signal transmitted and the signal leaked superimpose such that the signal transmitted is attenuated by the signal leaked without affecting the phase of the signal transmitted.

As indicated in FIG. 1, optionally, the ESD protection circuit 106 can comprise a third two port device 110_3, the two port device being switchable between a high impedance state and a low impedance state, wherein the phase shifter 100 comprises a third signal path 108_3 between the signal input 102 and the signal output 104, wherein the third signal path comprises 108_3 the third two port device 110_3 of the ESD protection circuit 106 and a third delay line 112_3 configured to provide a third phase shift, different from the first phase shift and the second phase shift, to the signal transmitted from the signal input 102 to the signal output 104 via the third signal path 108_3. Thereby, the first phase shift, the second phase shift and the third phase shift may differ in such a manner that a signal transmitted from the signal input 102 to the signal output 104 via one of the first two port device 110_1, the second two port device 110_2 and the third two port device 110_3 and signals leaked trough the other (two) of the first two port device 110_1, the second two port device 110_2 and the third two port device 110_3 from the signal input 102 to the signal output 104 superimpose such that the signals leaked are fully or partially canceled.

In embodiments, the phase shifts of the delay lines of the phase shifter 100 may differ by 360°/n, wherein n is a natural number equal to or greater than two. For example, if the phase shifter comprises two (n=2) signal paths 108_1 and 108_2 between the signal input 102 and the signal output 104 then the phase shifts of the two delay lines 112_1 and 112_2 of the two signal paths 108_1 and 108_2 may differ by 180°. For example, if the phase shifter comprises three (n=3) signal paths 108_1 to 108_3 between the signal input 102 and the signal output 104 then the phase shifts of the three delay lines 112_1 to 112_3 of the three signal paths 108_1 to 108_3 may differ by 120°. Naturally, also any other combination of different phase shifts may be used for implementing the phase shifter 100 disclosed herein.

Figure 2:
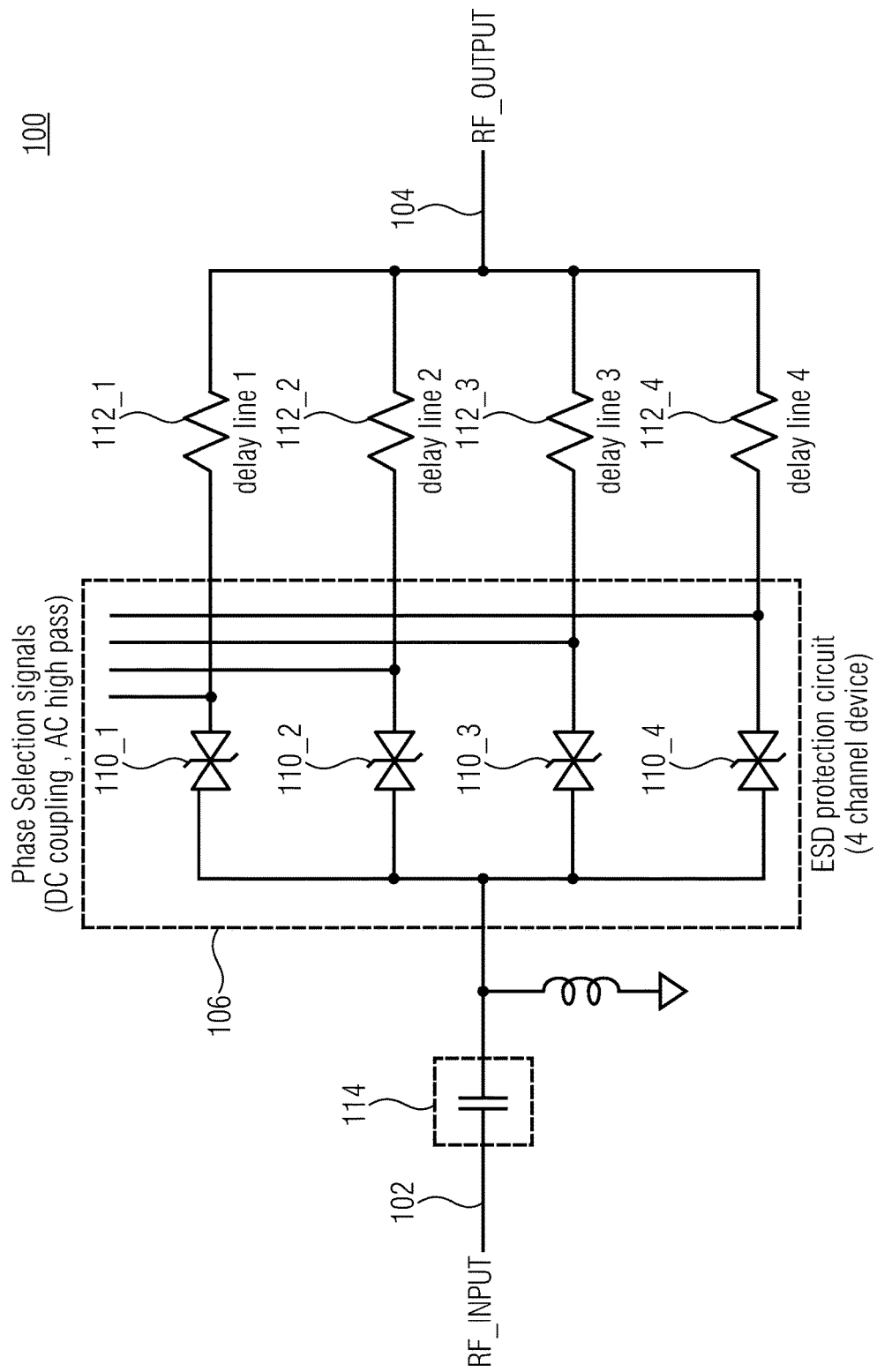
FIG. 2 shows a schematic block diagram of a phase shifter according to an embodiment.

FIG. 2 shows a schematic block diagram of a phase shifter 100 according to an embodiment. Compared to FIG. 1, in FIG. 2 a fourth signal path 108_4 between the signal input (RF input) 102 and the signal output (RF output) 104 are shown. The fourth signal path 108_4 comprises a fourth two port device 110_4 of the ESD protection circuit 106 and a fourth delay line 112_4.

As indicated in FIG. 2, each of the two port devices 110_1 to 110_4 of the ESD protection circuit 106 can be implemented by means of two reverse connected diodes. Naturally, also other implementations of the two port devices 110_1 to 110_4 of the ESD protection circuit 106 are possible. For example, each of the two port devices 110_1 to 110_4 of the ESD protection circuit 106 can be implemented by means of a uni-directional high-speed diode, a varactor type device or a thyristor type device.

Although the two port devices 110_1 to 110_4 are connected in a serial configuration in the embodiment of the phase shifter 100 shown in FIG. 2, it is noted that also other connection types are possible. For example, the two port devices 110_1 to 110_4 can be connected in a parallel or resonant configuration.

Further, the phase shifter 100 can be configured to apply a DC voltage which is equal to or higher than a breakdown voltage of the respective two port device 110_1 to 110_4 across the respective two port device 110_1 to 110_4 in order to switch the respective two port device from the low impedance state to the high impedance state. The DC voltage can be applied via a low pass filter to the respective two port device 110_1 to 110_4.

Furthermore, the phase shifter 100 can comprise a bias tee, a band pass filter or high pass filter 114 serially connected between the signal input 102 and the signal paths 108_1 to 108_4. For example, as indicated in FIG. 2, the phase shifter 100 can comprise a bias tee 114 (e.g., implemented by means of a serial capacitor). The bias tee 114 may decouple the RF signal from the (DC) branch for biasing.

As shown in FIG. 2, embodiments use ESD protection circuits 106 instead of PIN diodes, e.g. as binary "switch" in an otherwise known or modified phase shifter design. Similar to PIN diodes, many ESD protection circuits 106 are 2-port devices and can be toggled between an "isolating" (high impedance) and a "conducting" (low impedance) state by applying no or a sufficiently high direct-current (DC) voltage across the 2 ports. Using a combination of low-pass coupling for the DC-voltage and high-pass or band-pass coupling for the RF signal to be phase shifted, the DC control voltage can be applied and toggled to switch a transmission path for the RF signal, but without otherwise affecting the AC signal.

Various variants of ESD protection devices are known and can be used for the implementation of phase shifters 100. This includes devices with 2 reverse connected diodes in series (as symbolically shown in FIG. 2), uni-directional high-speed diodes, varactor type and thyristor type devices.

FIG. 2 shows one example for a phase shifter that uses a 4 channel ESD protection circuit 106. Each switch 110_1 to 110_4 is serially connected to one delay line (configured to providing different, e.g. 0°, 90°, 180° and 270° phase shifts). Typically exactly one of the 4 switches is "conducting" at a time, and all other switches are in "isolating" state. The "conducting" state of the switch is triggered by applying a sufficiently high voltage at one of the 4 "Phase Selection" signals, while leaving all other "Phase Selection" signals at low voltage. Triggering the "conducting" state is equal to triggering the ESD function of the protection circuit 106, resulting in a low impedance path across the circuit.

In a real-word build of the schematic shown in FIG. 2, the 3 switches in "isolating" state would still represent a parasitic capacitance. Given a sufficiently high frequency RF signal, at least some energy would leak through the "isolating" ESD protection circuit, propagate through the connected Delay Line and add to the RF_OUTPUT signal. However, due to the symmetrical construction in FIG. 2 and the dimensioning of the phase shifts in the delay lines 112_1 to 112_4, pairs (e.g. 0° and 180°, 90° and 270°) of signals have 180° phase offset and therefore cancel. Just the wanted signal (path with the conducting ESD protection circuit) and the "leaking" attenuated 180° offset signal remain an effective contributor to the RF_OUTPUT signal; the resulting signal is attenuated (due to partial destructive combining), but does not suffer from an additional phase error.

Embodiments of the phase shifter 100 provide the following advantages:

1) Compared to PIN diodes, ESD protection circuits are "mass market" products, actively developed and optimized for different application ranges.
   a) For the protection of high speed signal lines, ESD protection devices are e.g. optimized for low parasitic capacitance, high signal integrity and low attenuation at considerable high frequencies. Such optimizations include the characteristics of the core circuit as well at the package parasitic capacity, package size and mounting.
   b) Low parasitic capacitance (typ. down to 0.1 pF) allows operation at high frequency, including Ku- and Ka-Band used for Satellite communications.
   c) Device footprint (<1 mm2) and package is optimized for surface mounting; this allows assembly of the devices on the rear side of the printed circuit board used for the antenna array. Many devices fit within the "unit square" of one antenna element.
2) ESD protection devices are packed as singles units as well as in multi-channel configurations.
   a) Multi-channel configurations with common port simplify layout and improve signal integrity; the common port is especially advantageous as common port in a splitter or combiner configuration, e.g. to split and then route the signal through delay lines of different length.
   b) Devices in a multi-channel configuration share the same manufacturing legacy and are thus better matched, regarding their functional and parasitic parameters. This is advantageous in balancing the different paths in the multi-channel configuration and to exploit pair-wise cancelation of 180° offset "leaking" signals.
   c) Multi-channel configurations support the streamlined build-up of modular design blocks that are replicated identically and symmetrically across the antenna array.
   d) The complexity for controlling ("switching") the ESD protection circuit is limited; DC coupling of the control signal and high impedance isolation of the RF signal can be achieved by use of series inductors, e.g. implemented as wire structures on the PCB material.
   e) The complexity of a single phase shifter is low; devices with multiple channels are available in a single package, reducing manufacturing complexity.
3) ESD protection devices are passive and consume only small energy quantities for switching and in the "conducting" state, with typically only one of the n devices in conducting state and the other (n−1) devices "isolating". The "conducting" state is very low impedance and therefore low loss. This is a major benefit over the use of active components that, depending on operating frequency, may involve high bias currents, resulting in high power consumption and heat dissipation.
4) While some ESD protection devices are based on semiconductor material (e.g. conventional high speed silicon diode), other ESD protection devices use alternative materials, e.g. ceramics. Such alternative materials may allow direct printing of the ESD device onto the circuit board.

Figure 3:
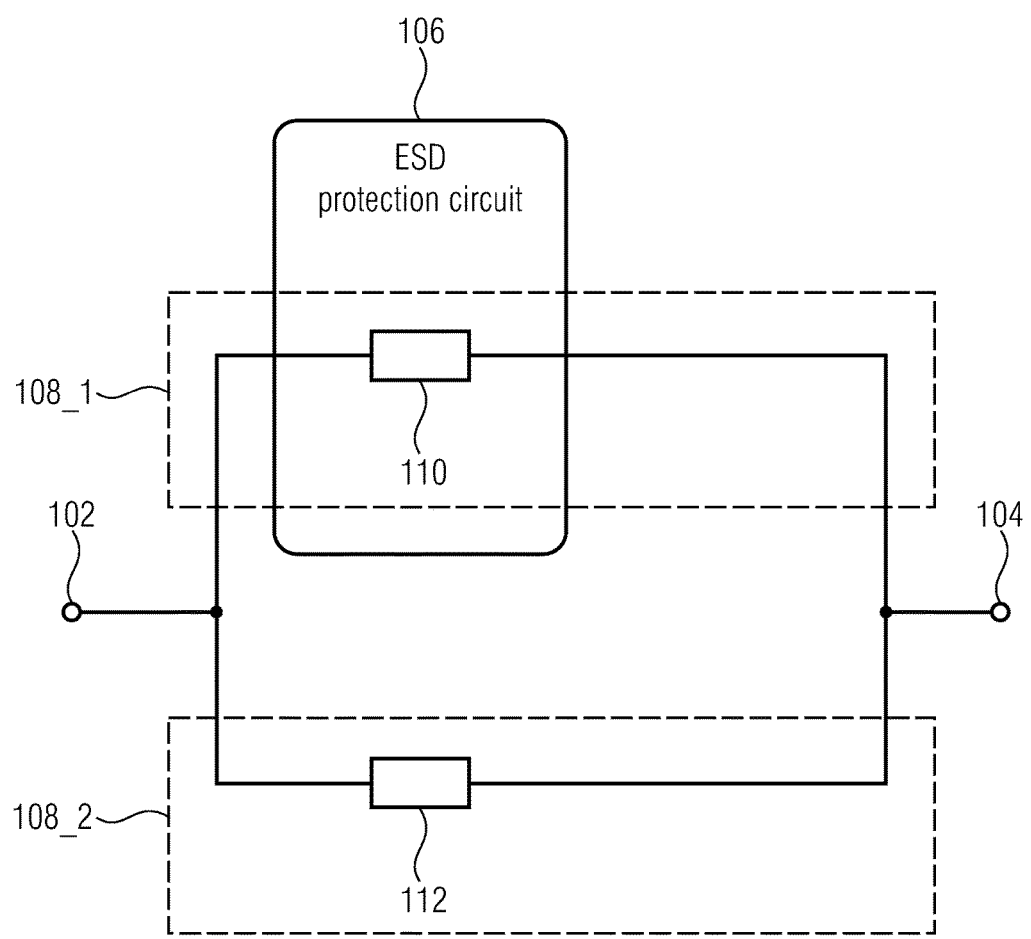
FIG. 3 shows a schematic block diagram of a phase shifter according to an alternative embodiment.
Figure 4A:
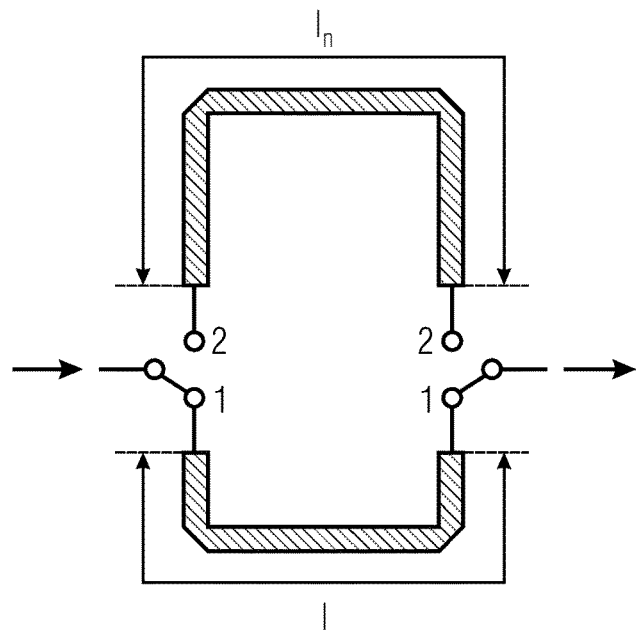
FIGS. 4a to 4c show schematic block diagrams of common phase shifters using switched transmission lines.
Figure 4B:
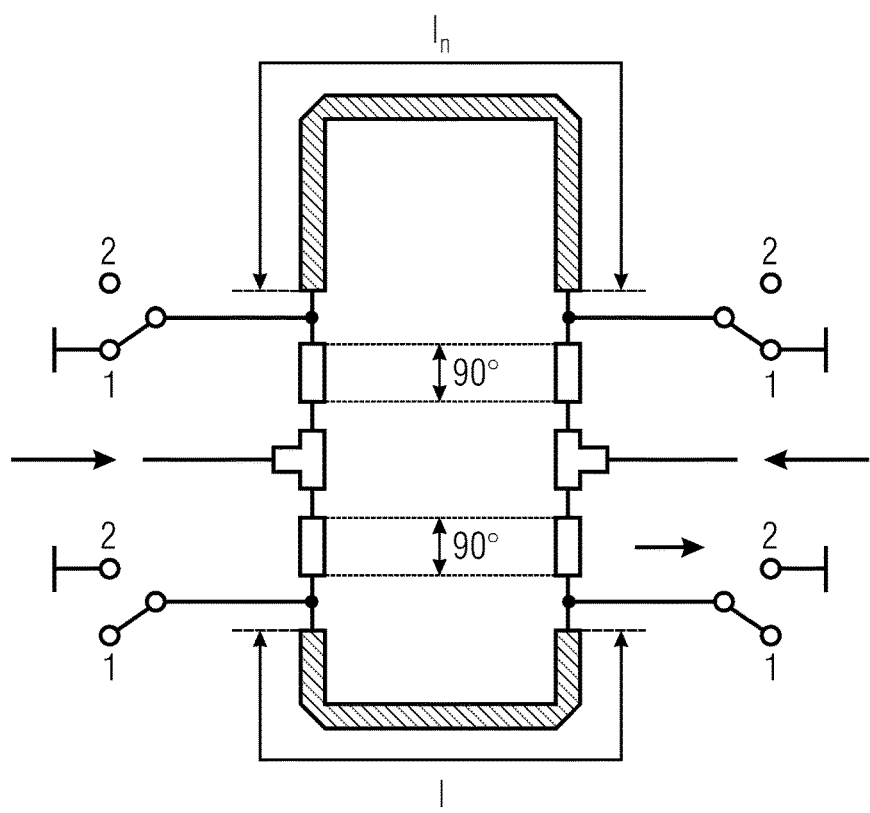
Figure 4C:
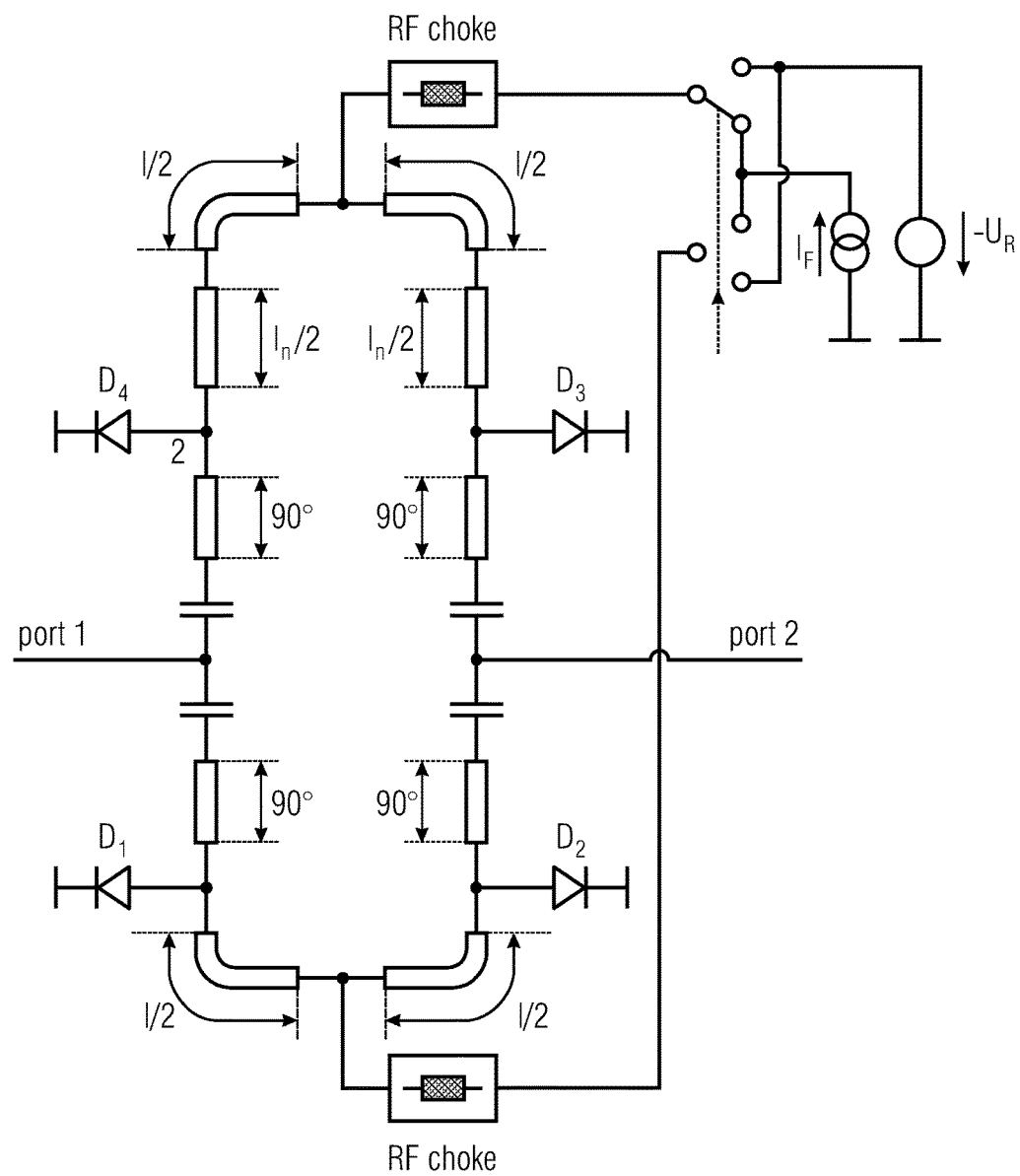

FIG. 3 shows a schematic block diagram of a phase shifter 120 according to a further embodiment. The phase shifter 120 comprises a signal input 102, a signal output 104, an ESD protection circuit 106, a first signal path 108_1 between the signal input 102 and the signal output 104 and a second signal path 108_2 between the signal input 102 and the signal output 104. The ESD protection circuit 106 comprises a two port device 110, the two port device 110 being switchable between a high impedance state and a low impedance state. The second signal path 108_2 comprises a delay line 112 configured to provide a phase shift to the signal transmitted from the signal input 102 to the signal output 104 via the second signal path 108_2. The phase shifter 120 is configured to apply an adjustable phase shift to the signal transmitted from the signal input 102 to the signal output 104 by switching the two port device 110 from the low impedance state to the high impedance state.

Note that the phase shifter 100 shown in FIGS. 1 and 2 and the phase shifter 120 shown in FIG. 3 may be combined with each other, for example, leading to a phase shifter similar to the phase shifter 100 shown in FIGS. 1 and 2 additionally comprising a n+1 signal path 108_$n$+1 comprising a n+1 delay line 112_$n$+1.

Embodiments of phase shifters of the invention may be applied in wireless communication devices and systems, for example in satellite communications, especially beam forming and tracking for moving receivers or transmitters, or other communication systems or devices including mobile phones, wireless local area networks, etc., that benefit from improved antenna gain and/or directivity. It is however, clear for those skilled in the art that the invention may find application in any field were adjustable phase shifters are needed.

Fully electronically steerable antennas can be implemented as "Phased Array", where the antenna consists of a number of antenna elements and where the signal received or transmitted by each element is individually shifted in phase. Direction of the pointing is a function of these phase shifts, resulting from constructive and destructive combining of the transmitted or received signals. This implementation of the phase shifter uses a set of different length delay lines, with one of the delay lines being used at a time. ESD protection circuits are used to implement the "electronic switch". Use of ESD protection circuits in this application is beneficial over the known state of the art (e.g. using PIN diodes, transistors, MEMS or discrete switches), due to the advantageous high frequency properties (conducting path optimized for high speed transients, low parasitic capacitance, optimized size and footprint) of such devices, the comparable low complex control and device cost.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A phase shifter, comprising:
a signal input;
a signal output;

an electrostatic discharge protection circuit comprising a first two port device and a second two port device, each two port device being switchable between a high impedance state and a low impedance state;

a first signal path between the signal input and the signal output, wherein the first signal path comprises the first two port device of the electrostatic discharge protection circuit and a first delay line configured to provide a first phase shift to a signal transmitted from the signal input to the signal output via the first signal path; and a second signal path between the signal input and the signal output, wherein the second signal path comprises the second two port device of the electrostatic discharge protection circuit and a second delay line configured to provide a second phase shift, different from the first phase shift, to the signal transmitted from the signal input to the signal output via the second signal path;

wherein the electrostatic discharge protection circuit is a circuit that is conventionally used for protecting electrostatic discharge sensitive electronic circuits from an electrostatic discharge; and wherein the first two port device and the second two port device are capable of non-destructively discharging electrostatic discharge voltages or electrostatic discharge currents in an electrostatic discharge event;

wherein each of the two port devices of the electrostatic discharge protection circuit is implemented
by means of two reverse connected diodes;
or by means of a uni-directional high-speed diode adapted to be operated in a reverse breakdown operation mode in the low impedance state.

2. The phase shifter according to claim 1, wherein the phase shifter is configured to apply an adjustable phase shift to the signal transmitted from the signal input to the signal output by switching one out of the first two port device and second two port device from the low impedance state to the high impedance state.

3. The phase shifter according to claim 1, wherein the first two port device and the second two port device are adapted to be operated in a reverse breakdown operation mode in the low impedance state.

4. The phase shifter according to claim 1, wherein the first two port device and the second two port device are optimized to discharge voltage peaks or current peaks in a fast manner such that the electrostatic discharge protection circuit is capable of protecting electronic devices connected downstream the electrostatic discharge protection circuit from the voltage peaks or current peaks.

5. The phase shifter according to claim 1, wherein the first two port device and the second two port device are configured to provide a low impedance at high frequencies such that the electrostatic discharge protection circuit is capable of conducting fast transient voltages or currents.

6. The phase shifter according to claim 1, wherein the first two port device and the second two port device comprise parasitic capacitances of less than 0.5 pF.

7. The phase shifter according to claim 1, wherein the first two port device and the second two port device are individually switchable between the low impedance state and the high impedance state.

8. The phase shifter according to claim 1, wherein the phase shifter is configured to apply a DC voltage which is equal to or higher than a breakdown voltage of the first two port device and the second two port device across the first two port device or the second two port device in order to switch the respective two port device from the low impedance state to the high impedance state.

9. The phase shifter according to claim 8, wherein the phase shifter is configured to apply the DC voltage via a low pass filter to the respective two port device.

10. The phase shifter according to claim 1, wherein the phase shifter comprises a band pass or high pass filter serially connected between the signal input and first and second signal paths.

11. The phase shifter according to claim 1, wherein the first two port device and the second two port device are connected in a serial, parallel or resonant configuration.

12. The phase shifter according to claim 1, wherein the first phase shift and the second phase shift differ in such a manner that a signal transmitted from the signal input to the signal output via one of the first two port device and the second two port device and a signal leaked trough the other one of the first two port device and the second two port device from the signal input to the signal output superimpose such that the signal transmitted is attenuated by the signal leaked without affecting the phase of the signal transmitted.

13. The phase shifter according to claim 12, wherein the first phase shift and the second phase shift differ by 180°.

14. The phase shifter according to claim 12, wherein the electrostatic discharge protection circuit comprises a third two port device, the two port device being switchable between a high impedance state and a low impedance state;

wherein the phase shifter comprises a third signal path between the signal input and the signal output, wherein the third signal path comprises the third two port device of the electrostatic discharge protection circuit and a third delay line configured to provide a third phase shift, different from the first phase shift and the second phase shift, to the signal transmitted from the signal input to the signal output via the third signal path;

wherein the first phase shift, the second phase shift and the third phase shift differ in such a manner that a signal transmitted from the signal input to the signal output via one of the first two port device, the second two port device and the third two port device and signals leaked trough the others of the first two port device, the second two port device and the third two port device from the signal input to the signal output superimpose such that the signals leaked are fully or partially canceled.

15. The phase shifter according to claim 14, wherein the first phase shift, the second phase shift and the third phase shift differ from each other by 120°.

16. The phase shifter according to claim 1, wherein the electrostatic discharge protection circuit comprises n two port devices, each of the n two port devices being switchable between a high impedance state and a low impedance state, wherein the phase shifter comprises n delay lines;

wherein the phase shifter comprises n signal paths between the signal input and the signal output, each signal path comprising one of the n two port devices of the electrostatic discharge protection circuit and one of the n delay lines, each delay line being configured to provide a phase shift to the signal transmitted from the signal input to the signal output, wherein the phase shifts of n the delay lines differ by 360°/n, wherein n is a natural number equal to or greater than two.

17. A phase shifter, comprising:
a signal input;
a signal output;

an electrostatic discharge protection circuit comprising a two port device, the two port device being switchable between a high impedance state and a low impedance state;

a first signal path between the signal input and the signal output, wherein the first signal path comprises the two port device of the electrostatic discharge protection circuit; and a second signal path between the signal input and the signal output, wherein the second signal path comprises a delay line configured to provide a phase shift to the signal transmitted from the signal input to the signal output via the second signal path;

wherein the phase shifter is configured to apply an adjustable phase shift to the signal transmitted from the signal input to the signal output by switching the two port device from the low impedance state to the high impedance state;

wherein the electrostatic discharge protection circuit is a circuit that is conventionally used for protecting electrostatic discharge sensitive electronic circuits from an electrostatic discharge; and wherein the two port device is capable of non-destructively discharging electrostatic discharge voltages or electrostatic discharge currents in an electrostatic discharge event;

wherein the two port device of the electrostatic discharge protection circuit is implemented
  by means of two reverse connected diodes;
  or by means of a uni-directional high-speed diode adapted to be operated in a reverse breakdown operation mode in the low impedance state.

* * * * *